United States Patent
Vanhaelemeersch et al.

(10) Patent No.: US 7,338,896 B2
(45) Date of Patent: Mar. 4, 2008

(54) FORMATION OF DEEP VIA AIRGAPS FOR THREE DIMENSIONAL WAFER TO WAFER INTERCONNECT

(75) Inventors: Serge Vanhaelemeersch, Leuven (BE); Eddy Kunnen, Kessel-Lo (BE); Laure Elisa Carbonell, Montlhéry (FR)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 237 days.

(21) Appl. No.: 11/305,421

(22) Filed: Dec. 16, 2005

(65) Prior Publication Data

US 2006/0223301 A1    Oct. 5, 2006

Related U.S. Application Data

(60) Provisional application No. 60/637,288, filed on Dec. 17, 2004.

(51) Int. Cl.
*H01L 21/46* (2006.01)
*H01L 21/4763* (2006.01)

(52) U.S. Cl. ................. 438/638; 438/456; 438/459

(58) Field of Classification Search ............ 438/455, 438/456, 459, 618, 638
See application file for complete search history.

(56) References Cited

U.S. PATENT DOCUMENTS

| | | | |
|---|---|---|---|
| 4,104,086 A | 8/1978 | Bondur et al. | |
| 5,098,865 A | 3/1992 | Beyer et al. | |
| 5,411,913 A | 5/1995 | Bashir et al. | |
| 6,165,890 A | 12/2000 | Kohl et al. | |
| 6,180,995 B1 | 1/2001 | Hebert | |
| 6,287,979 B1 | 9/2001 | Zhou et al. | |
| 6,307,247 B1 | 10/2001 | Davies | |
| 6,448,174 B1 | 9/2002 | Ramm | |

(Continued)

FOREIGN PATENT DOCUMENTS

EP    0 519 852 A    12/1992

(Continued)

OTHER PUBLICATIONS

Patent Abstracts of Japan, vol. 1999, No. 14; JP 11 243142 A Sep. 7, 1999, (Abstract only).

(Continued)

*Primary Examiner*—Alexander Ghyka
(74) *Attorney, Agent, or Firm*—Knobbe Martens Olson & Bear LLP

(57) ABSTRACT

A method for forming deep via airgaps in a semiconductor substrate is disclosed comprising the steps of patterning a hole in the substrate, partly fill said hole with a sacrificial material (e.g. poly-Si), forming spacers on the sidewalls of the unfilled part of the hole (e.g. TEOS) to narrow the opening, removing through said narrowed opening the remaining part of the sacrificial material (e.g. by isotropic etching) and finally sealing the opening of the airgap by depositing a conformal layer (TEOS) above the spacers. The method of forming a deep via airgap is used to create wafer to wafer vertical stacking. After completion of conventional FEOL and BEOL processing the backside of the wafer will be thinned such that the deep via airgap is opened and conductive material can be deposited within said (airgap) via opening and a through wafer or deep via filled with conductive material is created.

29 Claims, 10 Drawing Sheets

U.S. PATENT DOCUMENTS

| | | | |
|---|---|---|---|
| 6,548,391 B1 * | 4/2003 | Ramm et al. | 438/611 |
| 6,645,832 B2 * | 11/2003 | Kim et al. | 438/456 |
| 7,015,116 B1 | 3/2006 | Lo et al. | |
| 2002/0182819 A1 | 12/2002 | Schrems et al. | |
| 2003/0098493 A1 | 5/2003 | Marty et al. | |
| 2003/0183943 A1 | 10/2003 | Swan et al. | |
| 2003/0186486 A1 * | 10/2003 | Swan et al. | 438/125 |
| 2004/0056359 A1 * | 3/2004 | Lee et al. | 257/758 |
| 2004/0147093 A1 | 7/2004 | Marty et al. | |
| 2005/0221600 A1 * | 10/2005 | Daamen et al. | 438/622 |
| 2006/0131655 A1 | 6/2006 | Kunnen et al. | |

FOREIGN PATENT DOCUMENTS

| | | |
|---|---|---|
| EP | 0 519 852 A1 | 12/1992 |
| EP | 1 261 021 A | 11/2002 |
| JP | 11 243142 A | 9/1999 |
| JP | 2000 183149 A | 6/2000 |
| JP | 2001 326325 A | 11/2001 |
| WO | WO 01/26137 A | 4/2001 |

OTHER PUBLICATIONS

Patent Abstracts of Japan, vol. 2000, No. 9; JP 2000 183149 A Jun. 30, 2000, (Abstract only).

European Search Report for Corresponding European Application No. EP 05447015.8 mailed on Mar. 2, 2006.

European Search Report for related European Application No. 05447284.0-2203, dated Mar. 7, 2006.

Gutmann R. J. et al.: "Three-dimensional (3D) ICs: A technology platform for integrated systems and opportunities for new polymeric adhesives" First International IEEE Conference on Polymers and Adhesives in Microelectronics and Photonics. Incorporating Poly, Pep & Electronics. Proceedings, Oct. 21, 2001, pp. 173-180, XP002368204.

Washio, et al., A 50-GHz Static Frequency Divider and 40-Gb/s MUX/DEMUX Using Self-Algined Selective-Epitaxial-Growth SiGe HBTs with 9-pcs ECL, IEE Transactions on Electronic devices, vol. 48, 2001.

Unpublished U.S. Appl. No. 11/408,100, filed Apr. 20, 2006 to Kunnen et al.

* cited by examiner

*PRIOR ART*

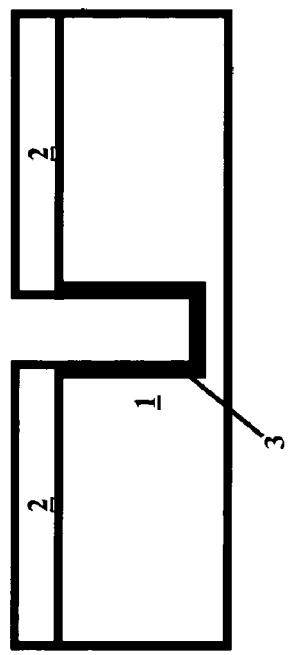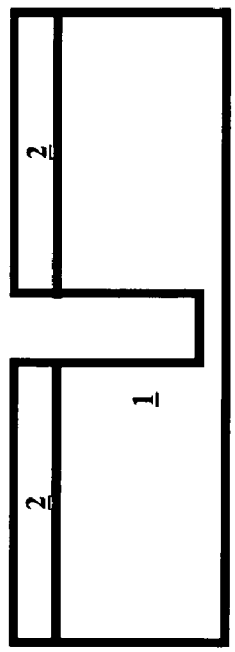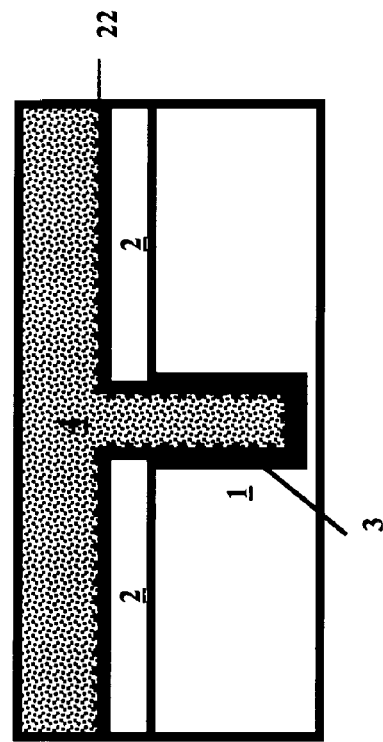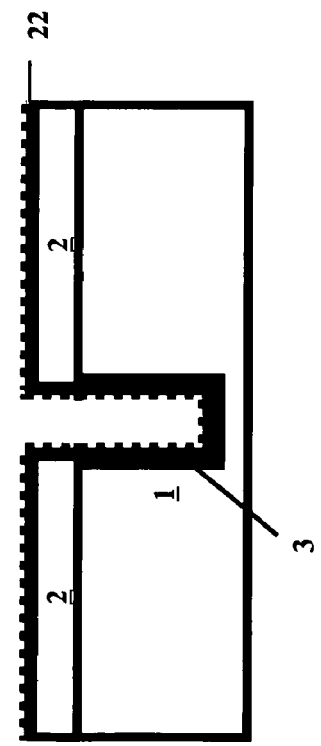
Figure 4A
Figure 4B
Figure 4C
Figure 4D

FORMATION OF DEEP VIA AIRGAPS FOR THREE DIMENSIONAL WAFER TO WAFER INTERCONNECT

CROSS REFERENCE TO RELATED APPLICATION

This application claims the benefit of U.S. Provisional Application No. 60/637,288, filed Dec. 17, 2004, which is incorporated by reference herein in its entirety, and is hereby made a portion of this specification

FIELD OF THE INVENTION

The present invention is related to the field of forming deep vias filled with a gas (air) in a semiconductor substrate, also referred to as deep via airgaps. Said deep via airgaps are used to create through wafer vias filled with conductive material for three dimensional (3D) wafer to wafer interconnect structures also referred to as vertically stacking of wafers or three dimensional semiconductor integrated circuit devices.

BACKGROUND OF THE INVENTION

For decades, semiconductor manufacturers have been shrinking transistor size in ICs to achieve the yearly increases in speed and performance described by Moore's Law—chip performance will double every ~18 months. Moore's Law exists only because the RC delay has been negligible in comparison with signal propagation delay. For submicron technology, however, RC delay becomes a dominant factor. It was hoped that change to copper metallurgy, low-k dielectrics and chemical mechanical polishing (CMP) would lower the RC delay and allow the performance increases predicted by device scaling and Moore's Law to continue through this decade.

While copper and CMP have been integrated smoothly into the IC fabrication process, the same cannot be said for spin-on or CVD low-k dielectrics. To lower the permittivity and thus the line capacitance, IC manufacturers were forced to resort to materials with no prior history in chip production. The semiconductor industry has postponed three times (three nodes) the transition to true low-k (k<2.8) ILDs, with reliability and yield problems being the major suspects for the implementation delays.

This inability to smoothly integrate low-k has generated many discussions concerning the end of device scaling as we know it, and has hastened the search for solutions beyond the perceived limits of current 2-D silicon devices. One emerging solution is 3-D integration also referred to as 3D interconnect. 3D interconnect structures are advantageously not only because of the size reduction, other drivers are mainly the fact that in 2D structures long interconnects are too slow and consume too much power. If a large number of these long interconnects needed in 2-D structures could be replaced by short vertical interconnects, this would greatly enhance performance. While silicon real estate is consumed by the vertical interconnect, a significant inter-wafer interconnect density can be achieved with a minimal area penalty. FIG. 1 illustrates a 2D- versus 3-D integration scheme and clearly shows that a large number of the long. interconnects needed in 2-D structures could be replaced by short vertical interconnects and greatly enhance performance. In particular, stacking just two wafers should offer an increase in performance by 15%, decrease power by 30% and reduce cost by 15% simply due to the decreased path lengths and required layers of metal to connect the transistors.

In prior art several solutions are described to realize a 3D stacking of wafers in which the direct wafer to wafer (or die to die) stacking with vertical connections through the silicon are realized by means of "through wafer" vias filled with copper. These through wafer vias are etched after completion of the full Front End of Line (FEOL) processing and often after complete BEOL processing. A modified damascene technique is used to fill said through wafer vias with conductive material such as copper.

In the realization of these "through wafer" vias or deep vias there are still a lot of problems to be solved. A first problem is related to the thermal budget available after etching the deep via through the BEOL, FEOL and subsequent silicon substrate. These deep vias are filled with conductive materials such as copper, a barrier layer such as TaN and optionally a copper seed layer. To isolate said conductive materials from the bulk of the substrate there is a need to deposit a dielectric isolator (liner) within the via. Typically, these dielectric isolators (e.g. TEOS oxide) are deposited before the deposition of said conductive materials by means of thermal and plasma enhanced deposition techniques (such as LP-CVD, ALD, PE-CVD, . . . ) which typically have a rather high thermal budget which is not compatible at that stage of the processing (thermal budget is preferably lower than 450° C.).

A second problem to the creation of said deep vias is related to hardmask selective (etch) processing, which is very difficult to achieve at that stage of the processing. A very thick hardmask layer needs to be deposited (to avoid damage to layers underneath) which leads to hardmask residues afterwards that need to be removed by e.g. Chemical Mechanical Polishing (CMP). Said CMP processing is very critical and difficult to perform at that stage of the processing, e.g. damage to the W contact plugs is absolutely to be avoided.

In U.S. Pat. No. 6,448,174 via holes are created after full completion of FEOL and BEOL processing. These vias are first filled with an organic adhesive layer such that a handling wafer (also called carrier wafer) could be glued onto the top substrate. Subsequently the backside of the wafer is thinned as far as the via holes such that these vias are opened from the back and connected in subsequent processing to a second wafer surface. The carrier wafer and organic adhesive are then removed and the via is filled with conductive material such as tungsten.

In U.S. Pat. No. 6,645,832 first two wafers containing active IC devices (after finishing a full FEOL and BEOL processing) are bonded together via a metal bonding layer deposited on opposing (top) surfaces of both wafers at designated bonding areas such that electrical connections between active devices on both wafers are established. After the wafer bonding is completed one or more interwafer vias are etched in the top wafer top establish electrical connections of the active devices of both wafers and an external interconnect

SUMMARY OF THE INVENTION

A method for forming a "deep via airgap" in a semiconductor substrate is disclosed. More specifically said deep via airgap is created before semiconductor processing such as Front End of Line (FEOL) and Back End Of Line (BEOL) processing in a semiconductor substrate such as a Si wafer. Preferably said deep via airgap has a diameter from 1 µm up to 10 µm and more preferred between 2 and 6 µm. Preferably said deep via airgap has a depth into the substrate (also referred to as length) from 10 μm up to 100 μm and more preferred between 20 and 50 μm.

The method for forming deep via airgaps comprises the steps of first patterning a via (hole) in a substrate. Said substrate is preferably a semiconductor substrate such as a Si wafer and most preferred before any semiconductor processing e.g. before the creation of active components has taken place. Within said via first an isolation liner is thermally grown onto the sidewalls by exposing the sidewalls to an oxidizing ambient and optionally and depending on further applications of the deep via airgap extra conformal layers can be deposited such as combinations of a nitride layer with a silicon-dioxide layer on top of said nitride layer or a Cu barrier layer with a silicon-dioxide layer on top of said barrier layer. Preferably said isolation liner is made of silicon-dioxide such as TetraEthylOrthoSilicate-oxide (TEOS-oxide) or a nitride such as Si3N4. Subsequently, said via is partly or completely filled with a sacrificial material (e.g., polysilicon).

In case the via is completely filled with sacrificial material, techniques such as dry etch or wet etch can be used to remove said sacrificial material such that a partly filled via is created.

Within said partly filled via, spacers are formed on the sidewalls of the unfilled part of the via. Preferably said spacers are made of TEOS-oxide and said spacers are used to narrow the opening of the via. Through said narrowed opening, the remaining part of the sacrificial material (e.g., by isotropic etching) is preferably removed and the opening of the via is sealed by depositing a conform layer (TEOS-oxide) above the spacers such that a "deep via airgap" is created. The sealing part of said deep via airgap is also referred to as the airgap plug.

The method for forming a deep via airgap is preferably used to realize a through wafer or deep via filled with conductive material for wafer to wafer or die to die interconnect also referred to as three dimensional (3D) stacking of wafers or dies. In such applications, contact plugs (e.g. W plugs) are created within the airgap plug to establish an interconnect with the (copper) lines within the BEOL. An advantage of the methods of preferred embodiments to fabricate through wafer or deep vias for wafer to wafer interconnect starting from an airgap via which is created before FEOL processing is the fact that there is no thermal budget at that stage, there are no limitations in choice of hardmask layers to be used for patterning the via and there is no waste of valuable surface area in the BEOL level. To overcome said problems first a deep via airgap will be created before FEOL processing is started and after completion of a full BEOL processing said deep via airgap will be transformed into a through wafer or deep via filled with conductive material. During the creation of the deep via before FEOL processing there is no limitation in thermal budget and a wide variety of conformal and better quality isolation liners such as LP-CVD-TEOS or Si3N4 which are typically deposited at higher temperatures can be deposited onto the sidewalls of said deep via. Said isolation liner needs to be deposited to isolate the deep via filled with conductive material (as described in further processing) towards the bulk Si substrate. Optionally there can be a barrier layer deposited on the sidewalls of the deep via airgap.

Accordingly, a method for transforming the deep via airgap of the current invention into a through wafer or deep via filled with conductive material is provided. Said transformation is realized after completion of a full FEOL and BEOL processing. Preferably the method starts with thinning the backside of the wafer such that the deep via airgap is opened, said thinning of the wafer is preferably achieved by chemical mechanical polishing, grinding and/or silicon wet etch processes. Subsequently part of the airgap plug is removed such that the contact plugs (e.g. W plugs) are free at the bottom of the deep via airgap. If no barrier layer is deposited yet, a barrier layer needs to be formed onto the sidewalls of said deep via to avoid migration of conductive material into the substrate. Conductive material is then deposited into the deep via, said conductive material can be a metal such as copper, aluminum, tungsten, a conductive polymer, metal silicides and/or conductive carbon nanotubes (CNT), conductive nanowires etc. Deposition processes such as conventional physical vapor deposition (PVD), chemical vapor deposition (CVD), electrochemical methods such as electroplating (ECP)/electrodeposition (ECD) and direct plating can be used to fill up said via and if necessary or optionally a seed layer can be deposited first. If the contact plugs can be used a starting point for electrochemical plating, there is no need to deposit a seedlayer first.

The method of the present invention is used to create a three dimensional stacked semiconductor device. Said device is also referred to as 3 dimensional Interconnect (IC) stacking, wafer to wafer bonding and wafer stacking. Said device is characterized as comprising at least a first wafer having a through wafer via filled with conductive material and a second wafer. Said through wafer via is characterized as situated completely in the wafer substrate of the first wafer. Both wafers further comprise active IC devices (FEOL and BEOL interconnect structures). Said first and second wafer are contacted to each other by means of the through wafer via situated in the first wafer, preferably the back side of the first wafer comprising the through wafer via will be connected (also referred to as bonding) to the front side of the second wafer. More specifically the through wafer via will be connected to the interconnect structures situated in the second wafer.

Applications including three dimensional stacking of wafers (dies) include e.g. stacking of respectively logic and memory products, stacking of low power units with defect tolerant memory units and SOC (System On Chip) type products.

In a first aspect, a method for fabricating a vertical stack of at least two wafers to create a three dimensional stacked semiconductor device using a through wafer via is provided, the method including the steps of: patterning at least one via having sidewalls in a first wafer; forming a partially filled-in portion of the via, wherein the partially filled-in portion includes a sacrificial material, whereby a portion of the sidewalls is exposed and a portion of the sidewalls is covered by the sacrificial material; forming spacers on the exposed portion of the sidewalls, whereby an opening to the via is narrowed; removing the sacrificial material through the narrowed opening; sealing the opening by depositing a sealing layer above the spacers, whereby an airgap with an airgap plug is formed; creating at least one contact hole in the airgap plug; filling the contact hole with a conductive material such that at least one contact plug is created; depositing a conductive structure onto the contact plug; making a contact to the contact plug by performing a conventional back end of line processing step; thinning a backside of the first wafer such that the airgap is opened, thereby forming a through wafer via or a deep via; depositing a conductive material in the through wafer via or the deep via to create in the first wafer either a through wafer via filled with conductive material or a deep via filled with conductive material, respectively; and contacting the backside of the first wafer through the through wafer via filled with conductive material or through the deep via filled with conductive material to an interconnect structure situated in a frontside of the second wafer.

In an embodiment of the first aspect, the step of forming the partially filled-in portion of the via includes the steps of: completely filling the via with a sacrificial material; and etching back a portion of the sacrificial material, whereby a portion of the sidewalls is exposed and a portion of the sidewalls is covered by the sacrificial material.

In an embodiment of the first aspect, the method further includes the step of forming a separating layer in the via, the separating layer including a thermally grown silicon-dioxide layer.

In an embodiment of the first aspect, the method further includes the step of depositing at least one additional isolation layer within the via, wherein the isolation layer includes a silicon-dioxide layer on top of either a silicon-nitride layer, a Cu barrier layer, or a ruthenium barrier.

In an embodiment of the first aspect, the step of forming the spacers includes the steps of: depositing a nitride layer as a dry etch endpoint triggering layer; thereafter closing or narrowing the opening by depositing a conformal layer including a spacer material within the via; and anisotropically etching back the spacer material, whereby spacers are formed.

In an embodiment of the first aspect, the sacrificial material is removed by an isotropic etching process.

In an embodiment of the first aspect, sealing the opening by depositing a sealing layer above the spacers includes depositing a sealing layer by a conformal deposition process.

In an embodiment of the first aspect, the conformal deposition process is a chemical vapor deposition process.

In an embodiment of the first aspect, the method further includes a step of planarizing the sealing layer.

In an embodiment of the first aspect, the planarizing step includes a chemical mechanical planarizing step.

In an embodiment of the first aspect, the first wafer is a silicon wafer.

In an embodiment of the first aspect, the sacrificial material is poly-silicon.

In an embodiment of the first aspect, the spacer material is silicon dioxide.

In an embodiment of the first aspect, the via has a diameter of from about 1 µm to about 10 µm.

In an embodiment of the first aspect, the via has a diameter of from about 2 µm to about 6 µm.

In an embodiment of the first aspect, the via has a depth in the first wafer of from about 10 µm to about 100 µm.

In an embodiment of the first aspect, the via has a depth in the first wafer of from about 20 µm to about 50 µm.

In an embodiment of the first aspect, the contact hole is created during front end of line processing by dry etching.

In an embodiment of the first aspect, at least one contact plug in the airgap via is created simultaneously with at least one contact plug in an active device of the semiconductor device.

In an embodiment of the first aspect, at least one contact hole has a diameter of from about 100 nm to about 200 nm.

In an embodiment of the first aspect, the method further includes the step of depositing an etch stop layer and thereafter depositing a dielectric layer on top of the etch stop layer, wherein the depositing steps are conducted after the creation of the airgap with the airgap plug. The etch stop layer can be selected from the group consisting of a SiON layer, a $Si_3N_4$ layer, a SiC layer, and a SiCN layer.

In an embodiment of the first aspect, the method further includes the step of depositing a barrier layer onto the sidewalls of the contact hole.

In an embodiment of the first aspect, the method further includes the step of depositing a conformal barrier layer into the contact hole prior to filling the contact hole with a conductive material, wherein the conductive material includes tungsten. The barrier layer can include a material selected from the group consisting of ruthenium, Ta(N), Ti(N), TaSiN, TiSiN, TiW, and W(C)N.

In an embodiment of the first aspect, thinning the backside of the wafer includes at least one chemical removal process or mechanical removal process.

In an embodiment of the first aspect, the method further includes the steps of: depositing a barrier layer; and thereafter depositing a seed layer or catalyst nuclei onto sidewalls of the through wafer via or the deep via, wherein the depositing steps are conducted after the step of thinning the backside of the wafer.

In an embodiment of the first aspect, the conductive material used to fill the through wafer via or the deep via is copper.

In an embodiment of the first aspect, the step of depositing a conductive material in the through wafer via or the deep via uses a method selected from the group consisting of physical vapor deposition, chemical vapor deposition, electroless deposition, and direct plating.

In a second aspect, a semiconductor device obtainable by a method according to the first aspect is provided.

In a third aspect, a three dimensional stacked semiconductor device is provided, the device including: a first wafer including at least one active integrated circuit device and having at least one through wafer via filled with a conductive material, the through wafer via having a top, a bottom, and sidewalls situated in a wafer substrate; a second wafer including at least one active integrated circuit device; the active devices of the first wafer and the second wafer making contact with each other through the through wafer via.

In an embodiment of the third aspect, the conductive material in the through wafer via includes at least one material selected from the group consisting of a metal, a conductive polymer, a metal silicide, conductive carbon nanotubes, and conductive nanowires.

In an embodiment of the third aspect, the conductive material in the through wafer via includes at least one metal selected from the group consisting of copper, aluminum, and tungsten.

In an embodiment of the third aspect, the sidewalls of the through wafer via include at least one isolation layer.

In an embodiment of the third aspect, the sidewalls of the through wafer via include at least one isolation layer, wherein the isolation layer includes a silicon dioxide layer on top of a silicon-nitride barrier layer, a copper barrier layer, or a ruthenium barrier layer.

In an embodiment of the third aspect, the sidewalls of the through wafer via comprise at least one isolation layer, wherein the isolation layer comprises a silicon-dioxide layer on top of a copper barrier layer, the barrier layer comprising at least one material selected from the group consisting of Ru, Ta(N), Ti(N), TaSiN, TiSiN, TiW, and W(C)N.

In an embodiment of the third aspect, the sidewalls of the through wafer via further include a seedlayer or catalysts on top of at least one isolation layer.

In an embodiment of the third aspect, the top of the through wafer via includes at least one contact plug.

In an embodiment of the third aspect, at least one contact plug is partly situated in the conductive material of the through wafer via.

In an embodiment of the third aspect, the contact plug includes tungsten.

BRIEF DESCRIPTION OF THE DRAWINGS

All drawings are intended to illustrate some aspects and embodiments. Devices are depicted in a simplified way for reason of clarity. Not all alternatives and options are shown and therefore the preferred embodiments are not limited to the content of the given drawings. Like numerals are employed to reference like parts in the different figures.

FIGS. 4A to 4H illustrate the different processing steps for forming a deep via airgap using the method of a preferred embodiment.

DETAILED DESCRIPTION OF THE PREFERRED EMBODIMENTS

Figure 1:
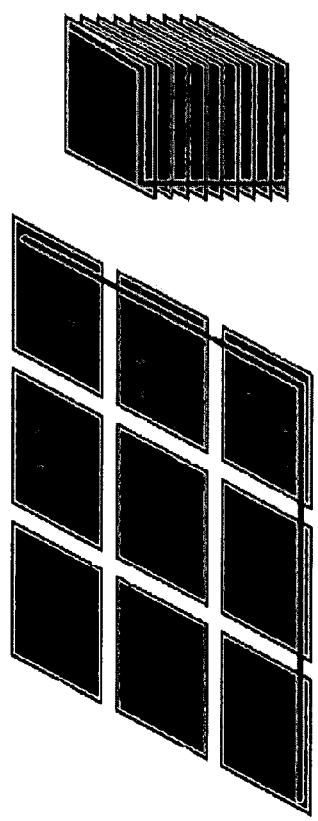
FIG. 1 (PRIOR ART) illustrates a 2D- versus 3-D integration scheme and clearly shows that a large number of the long interconnects needed in 2-D structures could be replaced by a short vertical interconnect that greatly enhances performance.
Figure 2:
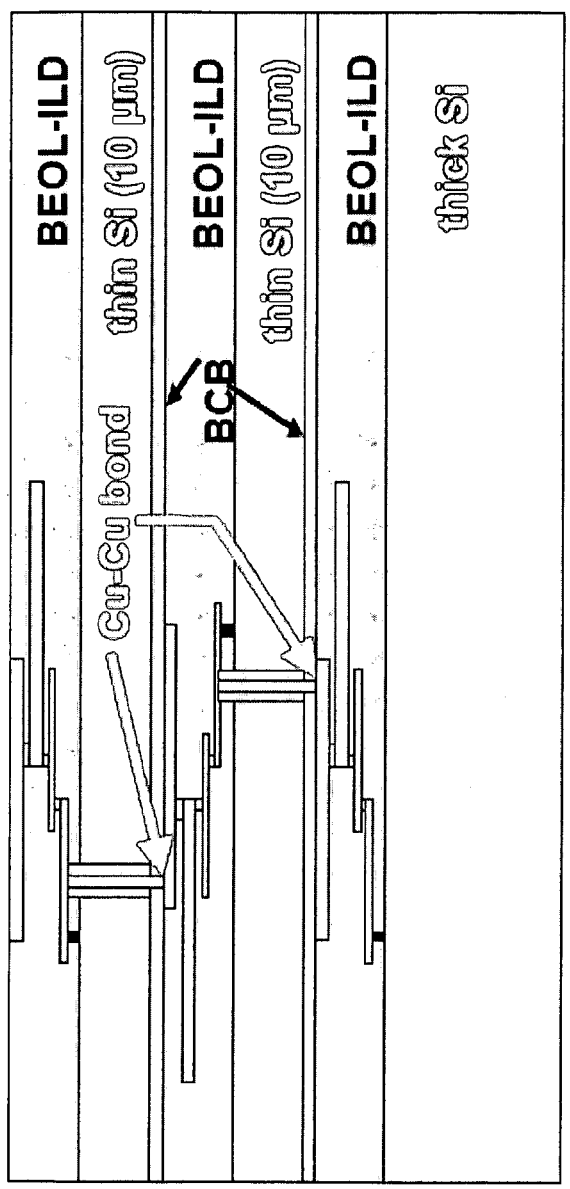
FIG. 2 (PRIOR ART) illustrates a 3-D integration scheme using a through wafer via that is created after BEOL processing.

The following description and examples illustrate a preferred embodiment of the present invention in detail. Those of skill in the art will recognize that there are numerous variations and modifications of this invention that are encompassed by its scope. Accordingly, the description of a preferred embodiment should not be deemed to limit the scope of the present invention.

The term "sacrificial," as used herein, is a broad term and is used without limitation, as a material or a layer that is deposited temporarily, and that is not supposed to remain, at least totally, in the final device, or a material or layer that is destined to be removed, at least partially, during the process of fabricating a device.

The term "spacer," as used herein, is a broad term and is used without limitation, as a material or layer that is deposited o the uncovered parts of the sidewalls of the via that is partially filled with a sacrificial material, in order to narrow the opening of said via. The step of forming spacers can include two sub-steps: deposition of a layer of a spacer material that closes or substantially narrows the opening, preferably by a conformal deposition process; and then etching back the layer of the spacer material, whereby the spacer is formed. The etchback step can be performed by any suitable etching process, preferably an anisotropic dry etch process (Reactive Ion Etch also referred to as RIE).

The term "wafer stacking" involves vertical stacking of at least two wafers on top of each other, and using through-silicon or through-wafer vias (interconnects) situated in a first wafer to connect to the interconnect structures of the second wafer. Said through-silicon or through-wafer vias are filled with conductive material. Said wafers are preferably identically sized/shaped wafers but not limited to that.

The term "vertically" stacked or vertical stacking of wafers means stacking of at least two wafers whereby the backside of the first wafer is connected to the frontside of the second wafers by means of at least one through-silicon (through wafer) via situated in the first wafer and connecting interconnect structures of both wafers. This can be repeated several times.

Method for Forming a Deep Via Airgap

A general method for forming the deep via airgap is described hereafter. The method is schematically presented in FIGS. 4A to 4H. In the example depicted in the Figures, the substrate 1 is a Si wafer. The substrate 1 is preferably a bare silicon wafer before any semiconductor processing such as FEOL processing. If the substrate 1 is to be protected, a "substrate protecting layer" 2 can be deposited. Subsequently this protecting layer 2 and the substrate are patterned. To create a deep via airgap, a via needs to patterned first. To perform said patterning photosensitive layers need to be deposited and the via pattern is transferred into said photosensitive layers using photolithography. Optionally and also preferred a hardmask layer is deposited onto the substrate first. Said hardmask layer can be used to transfer the photolithographic pattern using dry etch processing. At this stage of the processing there is no limiting thermal budget such that a wide variety of hardmask layers are suitable. The hardmask pattern is then transferred into the substrate using dry-etch processing.

Preferably said deep via airgap has a diameter from 1 μm up to 10 μm and more preferred between 2 and 6 μm. Preferably the depth (into the substrate) of said deep via airgap is from 10 μm up to 100 μm and more preferred between 20 and 50 μm.

Figure 4E:
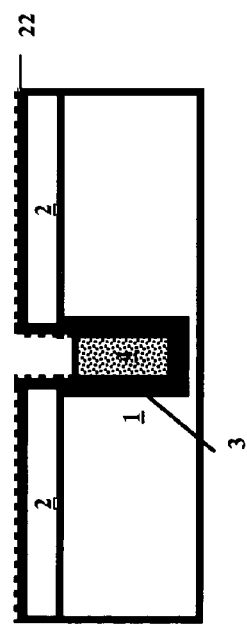

In the example shown in FIGS. 4A to 4H, the anisotropic patterning of the via is done by dry etch (e.g. a reactive ion plasma based etch). As shown in FIGS. 4B and 4C, first a separating layer can be formed within the via. This layer can be employed when it is difficult to remove the sacrificial material 4 selectively towards the substrate 1 afterwards. In the example depicted in the Figures within said via first an isolation liner is thermally grown onto the sidewalls by exposing the sidewalls to an oxidizing ambient, more specifically a 20 nm oxide layer as a separating layer is grown into the Si via surface (depicted in FIG. 4B) by a thermal or wet oxidation process.

Optionally and depending on further applications of the deep via airgap at least one additional (conformal) layer(s) 22 acting as isolation layer or barrier layer can be deposited onto the sidewalls of the via such as combinations of a silicon-nitride layer with a silicon-dioxide layer on top of said silicon-nitride layer or a Cu barrier layer with a silicon-dioxide layer on top of said barrier layer. Preferably said isolation liner is made of silicon-dioxide such as TetraEthylOrthoSilicate-oxide (TEOS-oxide) or a silicon-nitride such as Si3N4. Said additional layers 22 as shown in FIG. 4C can be of variable thicknesses (up to and including about 300 nm in thickness). Depending on the material of said additional layer 22, said layer can act as an isolation layer or in case the deep via airgap is used to create through wafer vias an extra liner acting as a barrier layer to prevent migration of conductive material towards the substrate can be deposited (optionally). In case the additional layer acts as an isolation layer, the deposited material can be an oxide such as TEOS-oxide or Si3N4, however, any other suitable dielectric material can be alternatively be employed.

Subsequently, the sacrificial material 4 is deposited to fill the via (see FIG. 4D). Any suitable sacrificial material can be employed. While polysilicon is generally preferred, other materials, for example, amorphous silicon, an oxide (removed by a wet etch) and appropriate organic materials having sufficient thermal budget can be used as alternative materials. Chemical Mechanical Polishing (CMP) or alternatively an etchback process (wet or dry) can be used to planarize this material towards the deposited liner 22. In case Chemical Mechanical Polishing (CMP) is used as planarizing method, deposited liner 22 can act as a stopping layer.

The sacrificial material 4 in the via is removed (e.g., by means of an etchback) until a level below the top of the protecting layer 2 is achieved such that a partly filled via is created (see FIG. 4E).

Figure 4F:
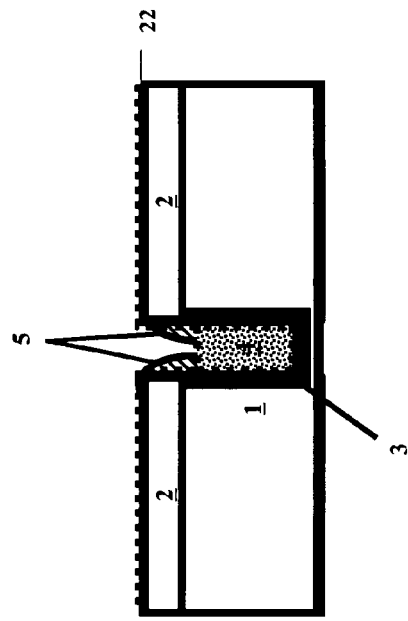

In FIG. 4F, spacers 5 are formed to narrow the opening of the via. The spacers are formed by a deposition process (e.g., a conformal deposition process) followed by an etchback process (e.g., an anisotropic etchback process). In the example depicted in the Figures, an oxide spacer is formed, more specifically, TEOS-oxide spacers are formed. For ease of dry etch endpoint triggering, a 10 nm nitride liner can be deposited first. The nitride layer can facilitate end point detection. In the example depicted in the Figures, the distance between the spacers after spacer formation is as close as possible.

Figure 4G:
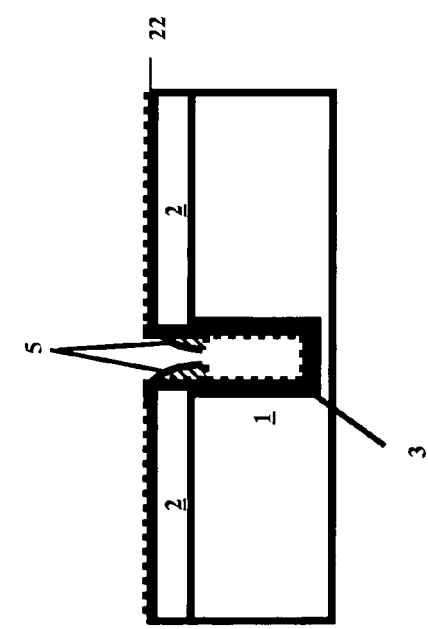

After spacer etching, the sacrificial material is removed through the opening formed between the spacers (see FIG. 4G). In the example depicted in the Figures, the sacrificial material is polysilicon and is preferably removed by, e.g. a SF6 based isotropic dry etch plasma. Other reactive gases can also be employed. Likewise, techniques such as down stream etching can be suitably employed as well. The sacrificial material is converted into a gas that can leave through the opening between the spacers. If oxide is used as a protective layer, the etching is selective towards oxide.

Figure 4H:
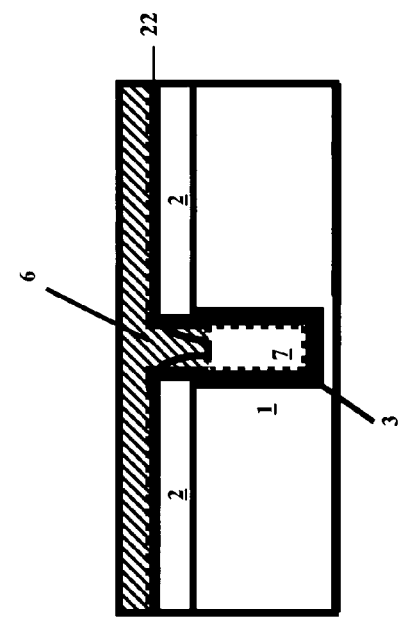

Finally, the opening between the spacers is sealed via a deposition process. In the example depicted in the Figures, a conformal oxide deposition process is employed to form the sealing layer 6 (e.g., a TEOS layer formed by Chemical Vapor Deposition). FIG. 4H shows the deep via airgap 7 formed after sealing the opening, a negligible amount of sealing material will be deposited inside the via (not shown). The deposited sealing layer 6 can be further planarized (e.g., by chemical mechanical planarization), stopping at the protecting layer 2. Accordingly, a deep via airgap is created that is situated completely in the substrate. While the above-described procedure is generally preferred for sealing the airgap, other deposition processes can also be suitable for use. Likewise, a non-conformal deposition process can alternatively be employed.

In another alternative method, the deposition of the sacrificial material 4 is such that a partly filled via is created and no further etchback is conducted.

Figure 7:
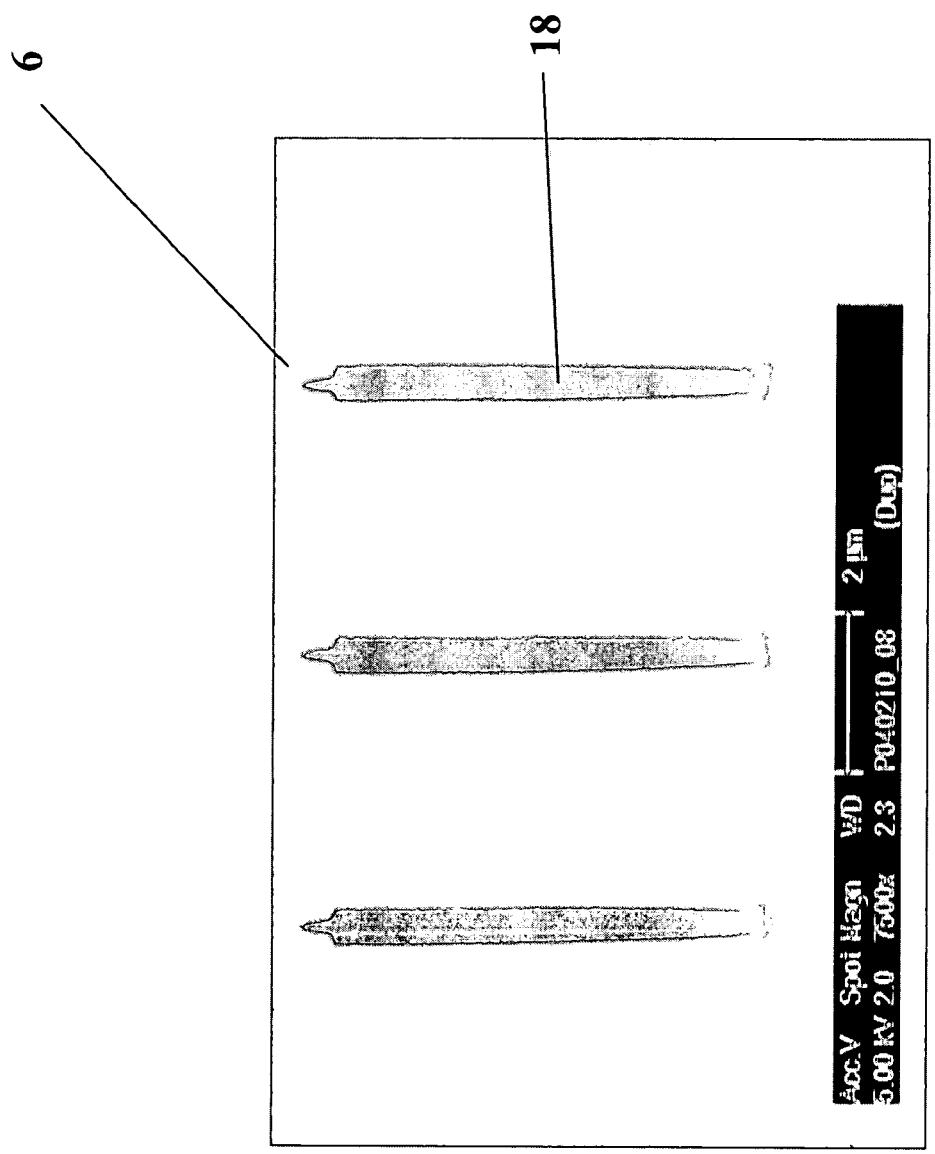
FIG. 7 shows a SEM picture illustrating the formation of a deep airgap 18 after removal of the sacrificial material (poly-silicon) by isotropic etching and deposition of a conformal layer 6 (e.g., TEOS-oxide deposition by Chemical Vapor deposition) to close the airgap.

FIG. 7 shows a SEM picture illustrating the formation of an airgap 18 after removal of the sacrificial material (polysilicon) by isotropic etching and deposition of a conformal layer 6 (e.g., TEOS-oxide deposition by Chemical Vapor deposition) to close the airgap.

Method for Filling a Deep Via Airgap with Conductive Material to Create a Through Wafer Via Interconnect for Three Dimensional Wafer Interconnects The methods of the preferred embodiments for forming deep via airgaps can be successfully applied to the formation of deep vias or through wafer vias to create 3D wafer interconnect structures. Said deep vias have a typical via depth of from about 10 µm to about 100 µm (most preferred between 20 µm and 50 µm) and a diameter of about 1 µm to 10 µm (most preferred between 2 µm and 6 µm).

Figure 5A:
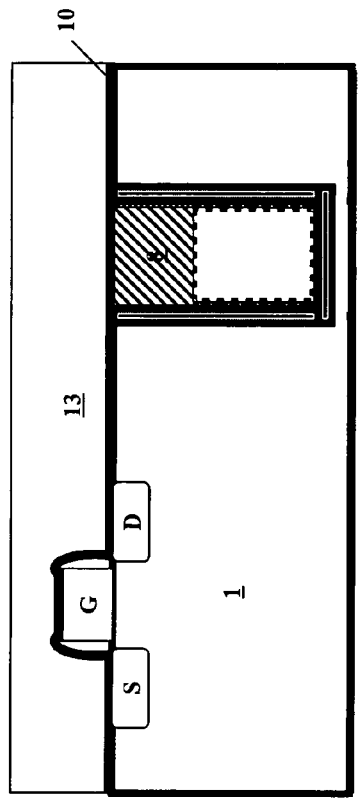
FIGS. 5A to 5H illustrate the additional processing steps to create contact plugs within the airgap plug in case the deep via airgap is used to form through wafer vias or deep vias filled with conductive material using the method of a preferred embodiment.
Figure 5B:
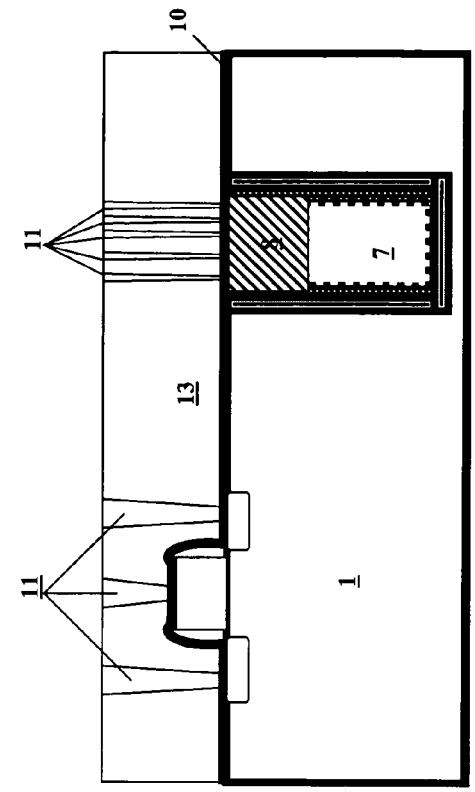
Figure 5C:
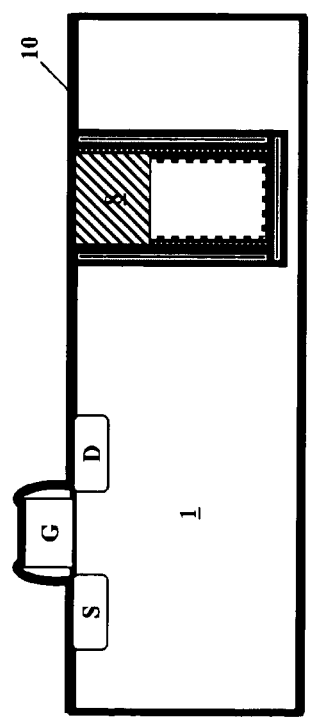
Figure 5D:
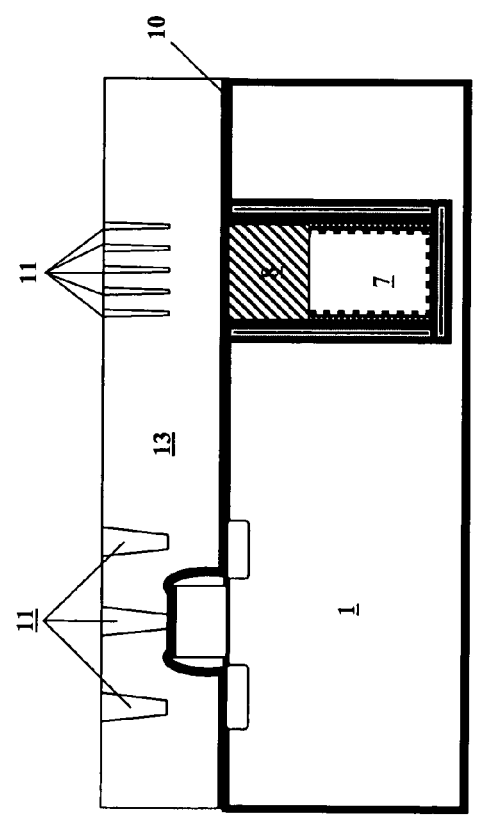
Figure 5E:
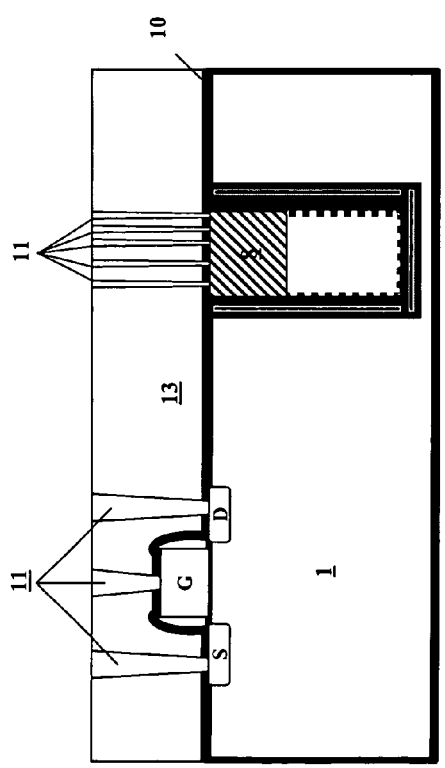
Figure 5F:
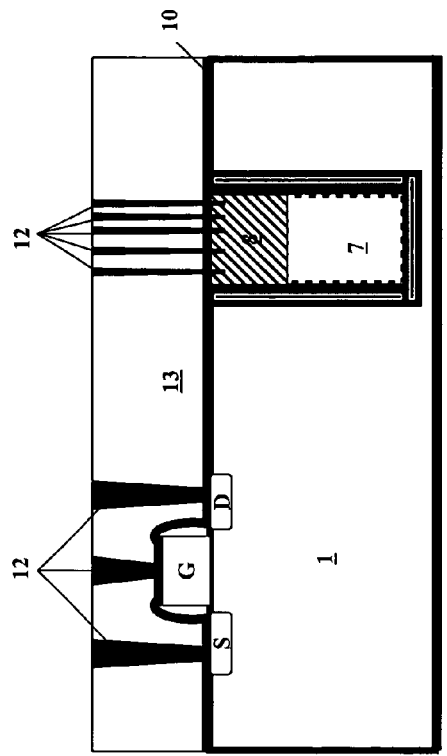
Figure 5G:
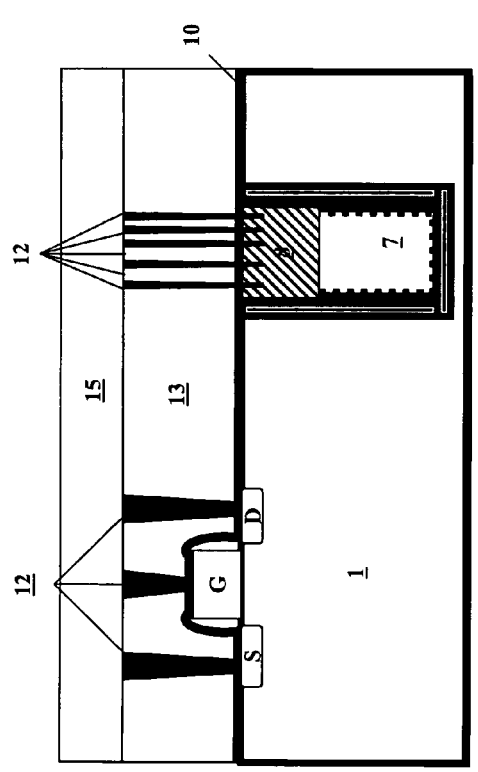
Figure 5H:
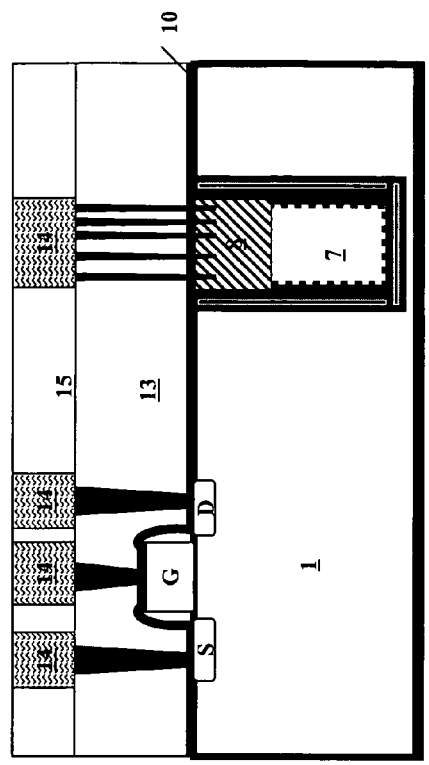

The additional processing steps needed to create deep vias or through wafer vias starting from airgap vias are illustrated in FIGS. 5A to 5H. After the creation of the airgap via as described in the previous part, contact holes are created in the airgap plug 8. These contact holes are needed to establish electrical contact to the (copper) interconnect lines of the BEOL structure created later on. Preferably said contact holes have a diameter of about 100 to 200 nm and most preferred about 150 nm. However, since the deep via is of a larger size also larger contacts can be considered. Preferably said contact holes are created during conventional FEOL processing. More preferred said contact holes are created simultaneously to the formation of W plugs in the active areas (comprising source, drain and gate) of the FEOL. First a layer is deposited onto the substrate comprising the airgap via and active areas. Said deposited layer 10 preferably has a thickness of around 50 nm and is preferably made of SiON, Si3N4, SiC or SiCN but not limited thereto. Above the deposited layer 10, the Pre Metal Dielectric (PMD) layer 13 will be deposited. By means of dry etch processing the pattern to create the contact holes 11 will be transferred into the PMD layer 13. Said pattern will be etched into the PMD layer 13 by an etch process selective towards said deposited layer 10 and using said deposited layer 10 as stopping layer as shown in FIGS. 5C and 5D. Subsequently the deposited layer 10 at the bottom of said created contact holes 11 will be removed and the contact holes 11 in the airgap plug 8 will be slightly extended as shown in FIG. 5E. In said contact holes a barrier layer such as TiN can be deposited first and subsequently said contact holes will be filled with a conductive material such that contact plugs 12 are created. Preferably said contact plugs are made of tungsten (W). Subsequently the IMD layer 15 will be deposited and within said IMD layer conductive structures 14 will be created to establish contact between the plugs 12 and BEOL interconnect structures of the BEOL. Additional layers needed to transfer the pattern of the conductive structures need to be deposited first. The final deep via airgap comprising the contact plugs 12 and a conductive structure 14 (preferably made of copper) deposited onto the contact plugs 12 such that contact to interconnect lines of the BEOL can be established is shown in FIG. 5H.

The different processing steps to create the through wafer or deep via filled with conductive material is shown in FIGS. 6A to FIGS. 6E. First the backside of the wafer is thinned such that the deep via airgap is opened (shown in FIG. 6A). Said thinning of the wafer is preferably achieved by chemical mechanical polishing, grinding and/or silicon wet etch processes. For ease of handling the wafer (front side) is preferably first deposited onto a carrier wafer. Subsequently part of the airgap plug 8 is removed such that the contact plugs 12 (e.g. W plugs) are free at the bottom of the deep via airgap. If no barrier layer is deposited yet, a barrier layer 16 needs to be formed onto the sidewalls of said deep via 7 to avoid migration of conductive material into the substrate. Conductive material is then deposited into the deep via, said conductive material is preferably a metal such as copper (Cu), aluminum (Al) or tungsten (W), alternatively a conductive polymer, metal silicides and/or conductive carbon nanotubes (CNT) or conductive nanowires can be considered as conductive materials. Deposition processes such as conventional physical vapor deposition (PVD), chemical vapor deposition (CVD), electroless deposition, electroplating, and direct plating can be used to fill up said via and if necessary or optionally a seed layer or catalyst (nuclei or layer) can be deposited first depending on the deposition technique. Said seedlayer will be different depending on the conductive material used to fill the via. If direct plating is used to fill the via with conductive material, the deposition of a thin seed layer directly onto a highly resistive barrier layer (Ti/TiN, WCN, WN, etc.) without or with the use of catalysts (Pd, Pt, W, Ru, etc.) is required. Direct Plating can also be used to deposit a seed layer (by using an alkaline bath with very low Cu concentration) in a first step and subsequently fill the via with conductive material (copper) in a second electroplating step involving the use of a conventional acidic plating bath. The use of electroless deposition (electroplating) has the advantage that it does not require an electrical contact. Electroless deposition is further characterized as a highly selective deposition technique which may require the use of catalyst nuclei that are deposited by galvanic displacement reactions on metals. In case of copper deposition onto barrier layers (e.g. Ta/TaN, Ti/TiN, W-based barriers, etc.), Pd can be used as a catalyst. With electroless deposition it is also possible to deposit other conductive materials such as Ni, Co using Pd nuclei as catalysts.

Figure 3:
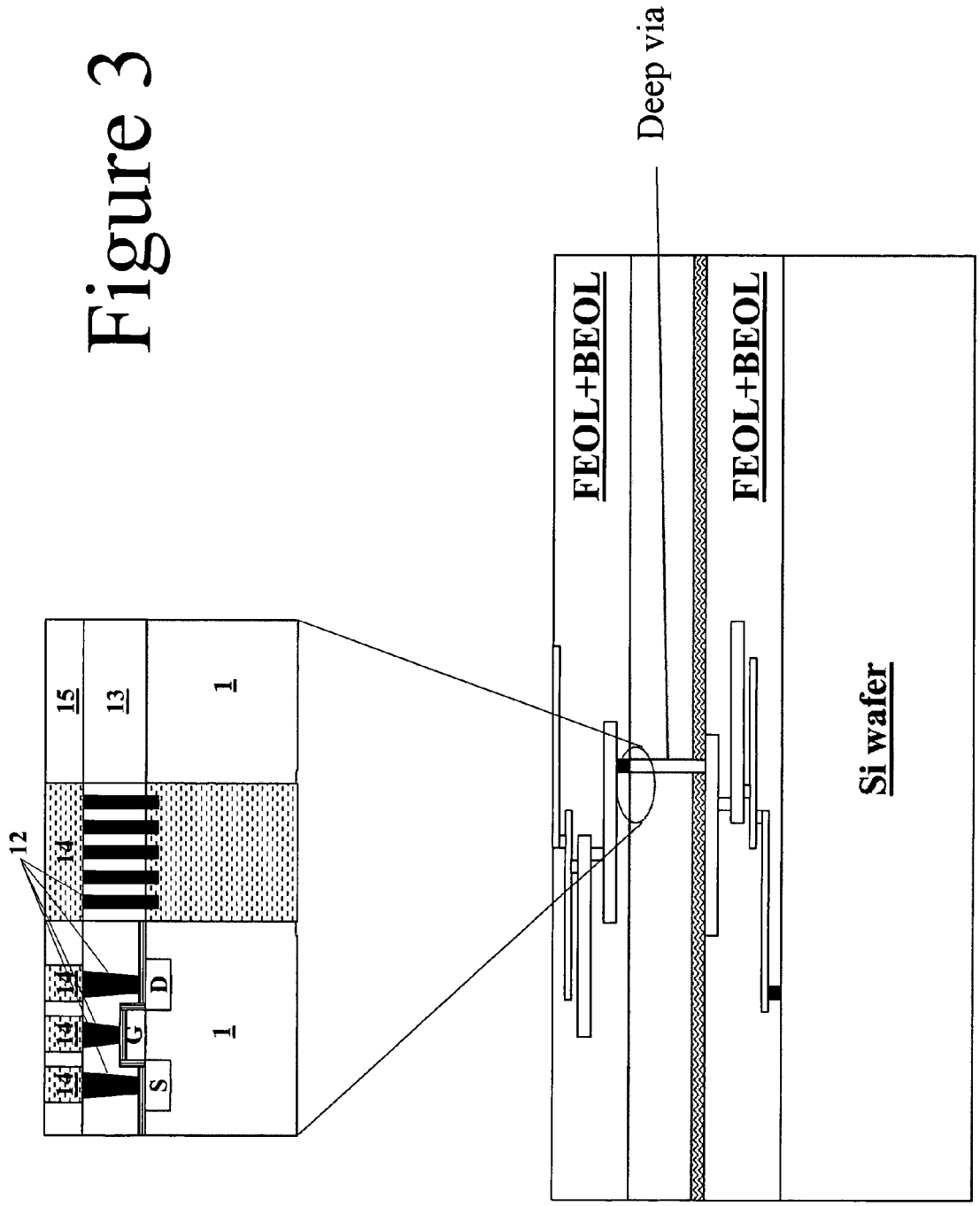
FIG. 3 illustrates the 3-D integration scheme according to the current invention using a through wafer via that is created before FEOL processing comprising W plugs within the airgap plug and which is filled with conductive material after full completion of BEOL processing.
Figure 6A:
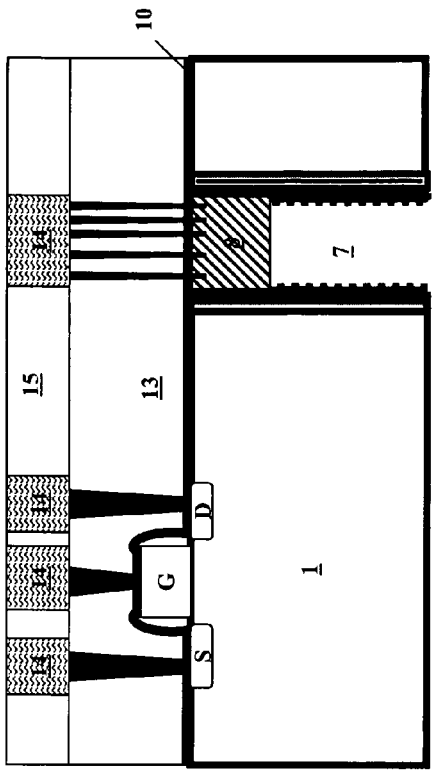
FIGS. 6A to 6E illustrate the different processing steps for forming a through wafer via or deep via filled with conductive material.
Figure 6B:
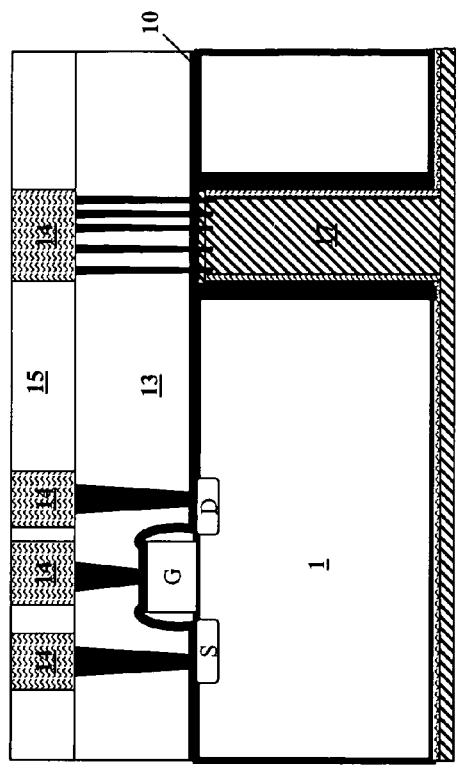
Figure 6C:
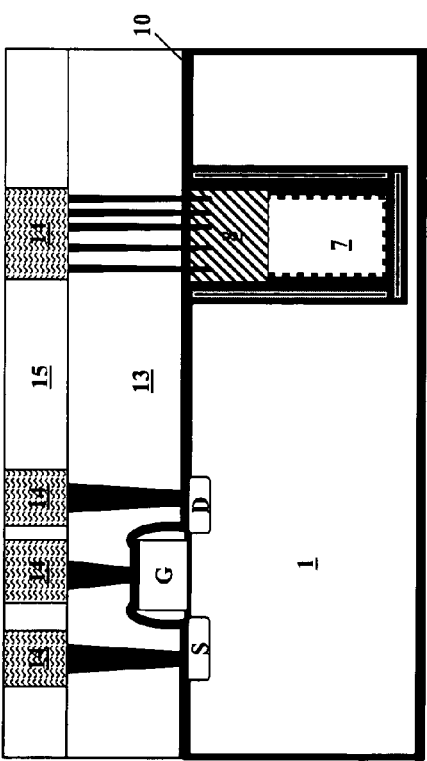
Figure 6D:
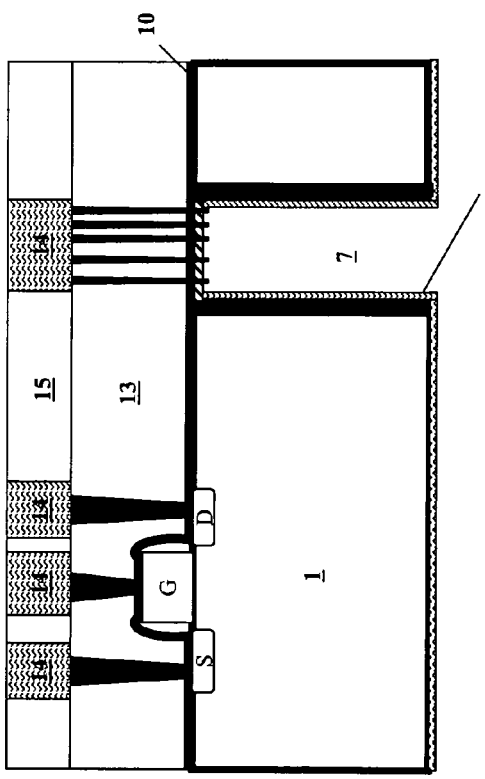
Figure 6E:
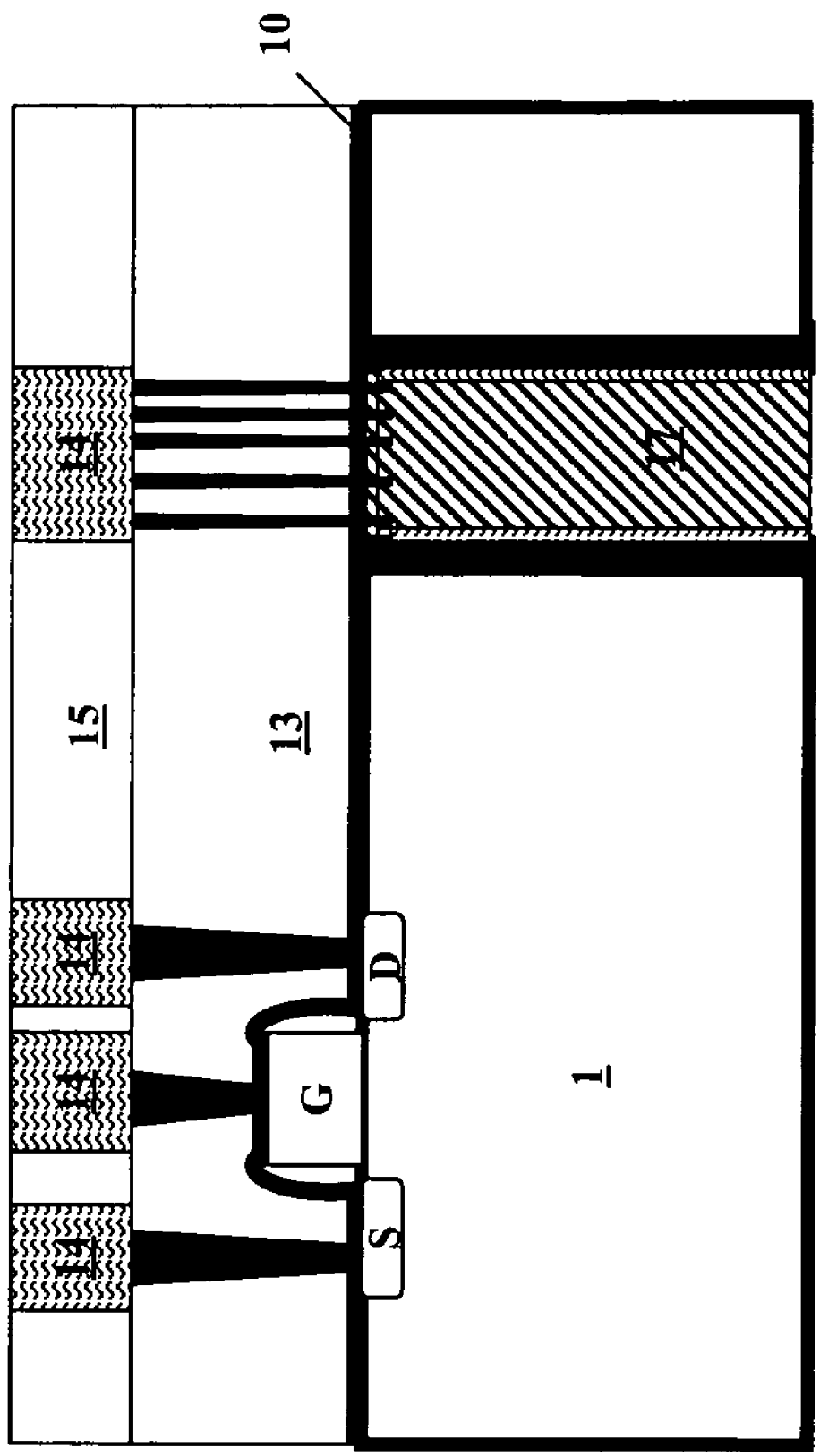

After filling the via with conductive material it might be necessary to do a planarization process (e.g. Chemical Mechanical Planarization) to remove the overburden of barrier layer, seedlayer and/or conductive material. The final through wafer or deep via ready to be used for wafer to wafer (interconnect) stacking is shown in FIG. 6E. FIG. 3 illustrates the deep via filled with conductive material in a 3D interconnect structure (here vertically stacking of two wafers is shown). On this illustration it is clear that the via hole is only situated in the substrate and not in the FEOL/BEOL areas. The W contact plugs 12 and active devices (comprising source/gate/drain) in the FEOL are also shown.

All references cited herein are incorporated herein by reference in their entirety and are hereby made a part of this specification. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A method for fabricating a vertical stack of at least two wafers to create a three dimensional stacked semiconductor device using a through wafer via, the method comprising the steps of:

patterning at least one via having sidewalls in a first wafer;

forming a partially filled-in portion of the via, wherein the partially filled-in portion comprises a sacrificial material, whereby a portion of the sidewalls is exposed and a portion of the sidewalls is covered by the sacrificial material;

forming spacers on the exposed portion of the sidewalls, whereby an opening to the via is narrowed;

removing the sacrificial material through the narrowed opening;

sealing the opening by depositing a sealing layer above the spacers, whereby an airgap with an airgap plug is formed;

creating at least one contact hole in the airgap plug;

filling the contact hole with a conductive material such that at least one contact plug is created;

depositing a conductive structure onto the contact plug;

making a contact to the contact plug by performing a conventional back end of line processing step;

thinning a backside of the first wafer such that the airgap is opened, thereby forming a through wafer via or a deep via;

depositing a conductive material in the through wafer via or the deep via to create in the first wafer either a through wafer via filled with conductive material or a deep via filled with conductive material, respectively; and contacting the backside of the first wafer through the through wafer via filled with conductive material or through the deep via filled with conductive material to an interconnect structure situated in a frontside of the second wafer.

2. The method of claim 1, wherein the step of forming the partially filled-in portion of the via comprises the steps of:

completely filling the via with a sacrificial material; and etching back a portion of the sacrificial material, whereby a portion of the sidewalls is exposed and a portion of the sidewalls is covered by the sacrificial material.

3. The method according to claim 1, further comprising the step of:

forming a separating layer in the via, the separating layer comprising a thermally grown silicon-dioxide layer.

4. The method according to claim 1, further comprising the step of:

depositing at least one additional isolation layer within the via, wherein the isolation layer comprises a silicon-dioxide layer on top of either a silicon-nitride layer, a Cu barrier layer, or a ruthenium barrier layer.

5. The method according to claim 1, wherein the step of forming the spacers comprises the steps of:
depositing a nitride layer as a dry etch endpoint triggering layer; thereafter
closing or narrowing the opening by depositing a conformal layer comprising a spacer material within the via; and
anisotropically etching back the spacer material, whereby spacers are formed.

6. The method according to claim 1, wherein the sacrificial material is removed by an isotropic etching process.

7. The method according to claim 1, wherein sealing the opening by depositing a sealing layer above the spacers comprises depositing a sealing layer by a conformal deposition process.

8. The method according to claim 7, wherein the conformal deposition process is a chemical vapor deposition process.

9. The method according to claim 1, further comprising a step of:
planarizing the sealing layer.

10. The method according to claim 9, wherein the planarizing step comprises a chemical mechanical planarizing step.

11. The method according to claim 1, wherein the first wafer is a silicon wafer.

12. The method according to claim 1, wherein the sacrificial material is poly-silicon.

13. The method according to claim 1, wherein the spacer material is silicon dioxide.

14. The method according to claim 1, wherein the via has a diameter of from about 1 µm to about 10 µm.

15. The method according to claim 1, wherein the via has a diameter of from about 2 µm to about 6 µm.

16. The method according to claim 1, wherein the via has a depth in the first wafer of from about 10 µm to about 100 µm.

17. The method according to claim 1, wherein the via has a depth in the first wafer of from about 20 µm to about 50 µm.

18. The method of claim 1, wherein the contact hole is created during front end of line processing by dry etching.

19. The method of claim 1, wherein at least one contact plug in the airgap via is created simultaneously with at least one contact plug in an active device of the semiconductor device.

20. The method of claim 1, wherein at least one contact hole has a diameter of from about 100 nm to about 200 nm.

21. The method of claim 1, further comprising the step of:
depositing an etch stop layer and thereafter depositing a dielectric layer on top of the etch stop layer, wherein the depositing steps are conducted after the creation of the airgap with the airgap plug.

22. The method of claim 21, wherein the etch stop layer is selected from the group consisting of a SiON layer, a $Si_3N_4$ layer, a SiC layer, and a SiCN layer.

23. The method of claim 1, further comprising the step of:
depositing a barrier layer onto the sidewalls of the contact hole.

24. The method of claim 1, further comprising the step of:
depositing a conformal barrier layer into the contact hole prior to filling the contact hole with a conductive material, wherein the conductive material comprises tungsten.

25. The method of claim 23, wherein the barrier layer comprises a material selected from the group consisting of ruthenium, Ta(N), Ti(N), TaSiN, TiSiN, TiW, and W(C)N.

26. The method of claim 1, wherein thinning the backside of the wafer comprises at least one chemical removal process or mechanical removal process.

27. The method of claim 1, further comprising the steps of:
depositing a barrier layer; and thereafter
depositing a seed layer or catalyst nuclei onto sidewalls of the through wafer via or the deep via, wherein the depositing steps are conducted after the step of thinning the backside of the wafer.

28. The method of claim 1, wherein the conductive material used to fill the through wafer via or the deep via is copper.

29. The method of claim 1, wherein the step of depositing a conductive material in the through wafer via or the deep via uses a method selected from the group consisting of physical vapor deposition, chemical vapor deposition, electroless deposition, and direct plating.

* * * * *